(12) United States Patent
Dukovski et al.

(10) Patent No.: US 7,700,447 B2
(45) Date of Patent: Apr. 20, 2010

(54) METHOD FOR MAKING A SEMICONDUCTOR DEVICE COMPRISING A LATTICE MATCHING LAYER

(75) Inventors: Ilija Dukovski, Newtonville, MA (US); Robert John Stephenson, Newton Upper Falls, MA (US); Jean Augustin Chan Sow Fook Yiptong, Worchester, MA (US); Samed Halilov, Waltham, MA (US); Robert J. Mears, Wellesley, MA (US); Xiangyang Huang, Waltham, MA (US); Marek Hytha, Brookline, MA (US)

(73) Assignee: Mears Technologies, Inc., Waltham, MA (US)

( * ) Notice: Subject to any disclaimer, the term of this patent is extended or adjusted under 35 U.S.C. 154(b) by 617 days.

(21) Appl. No.: 11/677,099

(22) Filed: Feb. 21, 2007

(65) Prior Publication Data

US 2007/0197006 A1 Aug. 23, 2007

Related U.S. Application Data

(60) Provisional application No. 60/775,287, filed on Feb. 21, 2006.

(51) Int. Cl.
*H01L 21/336* (2006.01)
(52) U.S. Cl. .............................. 438/285; 257/E21.124
(58) Field of Classification Search ................. 438/285, 438/590, 602; 257/E21.124
See application file for complete search history.

(56) References Cited

U.S. PATENT DOCUMENTS

| | | | |
|---|---|---|---|
| 4,485,128 A | 11/1984 | Dalal et al. | 427/85 |
| 4,594,603 A | 6/1986 | Holonyak, Jr. | 357/16 |
| 4,882,609 A | 11/1989 | Schubert et al. | 357/22 |

(Continued)

FOREIGN PATENT DOCUMENTS

EP 0 843 361 5/1998

(Continued)

OTHER PUBLICATIONS

Luo et al., *Chemical Design of Direct-Gap Light-Emitting Silicon*, published Jul. 25, 2002, The American Physical Society; vol. 89, No. 7.

(Continued)

*Primary Examiner*—Chandra Chaudhari
(74) *Attorney, Agent, or Firm*—Allen, Dyer, Doppelt, Milbrath & Gilchrist, P.A.

(57) ABSTRACT

A method for making a semiconductor device which may include forming a first monocrystalline layer comprising a first material having a first lattice constant, a second monocrystalline layer including a second material having a second lattice constant different than the first lattice constant, and a lattice matching layer between the first and second monocrystalline layers and comprising a superlattice. More particularly, the superlattice may include a plurality of groups of layers, and each group of layers may include a plurality of stacked semiconductor monolayers defining a semiconductor base portion and at least one non-semiconductor monolayer thereon. Furthermore, the at least one non-semiconductor monolayer may be constrained within a crystal lattice of adjacent base semiconductor portions, and at least some semiconductor atoms from opposing base semiconductor portions may be chemically bound together through the at least one non-semiconductor monolayer therebetween.

28 Claims, 8 Drawing Sheets

U.S. PATENT DOCUMENTS

| | | | | |
|---|---|---|---|---|
| 4,908,678 | A | 3/1990 | Yamazaki | 357/4 |
| 4,937,204 | A | 6/1990 | Ishibashi et al. | 437/110 |
| 4,969,031 | A | 11/1990 | Kobayashi et al. | 357/63 |
| 5,055,887 | A | 10/1991 | Yamazaki | 357/4 |
| 5,081,513 | A | 1/1992 | Jackson et al. | 357/23.7 |
| 5,216,262 | A | 6/1993 | Tsu | 257/17 |
| 5,357,119 | A | 10/1994 | Wang et al. | 257/18 |
| 5,577,061 | A | 11/1996 | Hasenberg et al. | 372/45 |
| 5,594,567 | A | 1/1997 | Akiyama et al. | 349/28 |
| 5,606,177 | A | 2/1997 | Wallace et al. | 257/25 |
| 5,616,515 | A | 4/1997 | Okuno | 438/478 |
| 5,627,386 | A | 5/1997 | Harvey et al. | 257/79 |
| 5,683,934 | A | 11/1997 | Candelaria | 437/134 |
| 5,684,817 | A | 11/1997 | Houdre et al. | 372/45 |
| 5,994,164 | A | 11/1999 | Fonash et al. | 438/97 |
| 6,058,127 | A | 5/2000 | Joannopoulos et al. | 372/92 |
| 6,255,150 | B1 | 7/2001 | Wilk et al. | 438/191 |
| 6,274,007 | B1 | 8/2001 | Smirnov et al. | 204/192 |
| 6,281,518 | B1 | 8/2001 | Sato | 257/13 |
| 6,281,532 | B1 | 8/2001 | Doyle et al. | 257/288 |
| 6,326,311 | B1 | 12/2001 | Ueda et al. | 438/694 |
| 6,344,271 | B1 | 2/2002 | Yadav et al. | 428/402 |
| 6,350,993 | B1 | 2/2002 | Chu et al. | 257/19 |
| 6,376,337 | B1 | 4/2002 | Wang et al. | 438/478 |
| 6,436,784 | B1 | 8/2002 | Allam | 438/380 |
| 6,472,685 | B2 | 10/2002 | Takagi | 257/77 |
| 6,472,694 | B1 * | 10/2002 | Wilson et al. | 257/189 |
| 6,498,359 | B2 | 12/2002 | Schmidt et al. | 257/190 |
| 6,501,092 | B1 | 12/2002 | Nikonov et al. | 257/29 |
| 6,521,549 | B1 | 2/2003 | Kamath et al. | 438/786 |
| 6,566,679 | B2 | 5/2003 | Nikonov et al. | 257/29 |
| 6,608,327 | B1 | 8/2003 | Davis et al. | 257/76 |
| 6,621,097 | B2 | 9/2003 | Nikonov et al. | 257/17 |
| 6,638,838 | B1 | 10/2003 | Eisenbeiser et al. | 438/481 |
| 6,646,293 | B2 | 11/2003 | Emrick et al. | 257/194 |
| 6,673,646 | B2 | 1/2004 | Droopad | 438/85 |
| 6,690,699 | B2 | 2/2004 | Capasso et al. | 372/44 |
| 6,711,191 | B1 | 3/2004 | Kozaki et al. | 372/43 |
| 6,748,002 | B2 | 6/2004 | Shveykin | 372/45 |
| 6,816,530 | B2 | 11/2004 | Capasso et al. | 372/50 |
| 2002/0094003 | A1 | 7/2002 | Bour et al. | 372/46 |
| 2003/0034529 | A1 | 2/2003 | Fitzgerald et al. | 257/369 |
| 2003/0057416 | A1 | 3/2003 | Currie et al. | 257/19 |
| 2003/0089899 | A1 | 5/2003 | Lieber et al. | 257/9 |
| 2003/0162335 | A1 | 8/2003 | Yuki et al. | 438/151 |
| 2003/0215990 | A1 | 11/2003 | Fitzgerald et al. | 438/172 |
| 2004/0084781 | A1 | 5/2004 | Ahn et al. | 257/777 |
| 2004/0227165 | A1 | 11/2004 | Wang et al. | 257/222 |

FOREIGN PATENT DOCUMENTS

| | | |
|---|---|---|
| GB | 2347520 | 9/2000 |
| JP | 61027681 | 2/1986 |
| JP | 61145820 | 7/1986 |
| JP | 61220339 | 9/1986 |
| JP | 62219665 | 9/1987 |
| WO | 99/63580 | 12/1999 |
| WO | 02/103767 | 12/2002 |

OTHER PUBLICATIONS

Tsu, *Phenomena in Silicon Nanostructure Devices*, University of North Carolina at Charlotte, Sep. 6, 2000.

Ye et al., *GaAs MOSFET with Oxide Gate Dielectric Grown by Atomic Layer Deposition*, Agere Systems, Mar. 2003.

Novikov et al., *Silicon-based Optoelectronics*, 1999-2003, pp. 1-6.

Fan et al., *N- and P-Type SiGe/Si Superlattice Coolers*, the Seventeenth Intersociety Conference on Thermomechanical Phenomena in Electronic Systems (ITherm 2000), vol. 1, pp. 304-307, Las Vegas, NV, May 2000.

Shah et al., *Experimental Analysis and Theoretical Model for Anomalously High Ideality Factors ($n>2.0$) in AlGaN/GaN P-N Junction Diodes*, Journal of Applied Physics, vol. 94, No. 4, Aug. 15, 2003.

Ball, *Striped Nanowires Shrink Electronics*, news@nature.com, Feb. 7, 2002.

Fiory et al., *Light Emission from Silicon: Some Perspectives and Applications*, Journal of Electronic Materials, vol. 32, No. 10, 2003.

*Lecture 6: Light Emitting and Detecting Devices*, MSE 6001, Semiconductor Materials Lectures, Fall 2004.

*Harvard University Professor and Nanosys Co-Founder, Charlie Lieber, Raises the Stakes in the Development of Nanoscale Superlattice Structures and Nanodevices*, Feb. 8, 2002, Nanosys, Inc.

*Motorola Creates Revolutionary Semicondcutor Materials: Potential to Transform Economics of Communications and Semiconductor Industries*, Motorola, Inc., Sep. 4, 2001.

* cited by examiner

METHOD FOR MAKING A SEMICONDUCTOR DEVICE COMPRISING A LATTICE MATCHING LAYER

CROSS-REFERENCE TO RELATED APPLICATIONS

The present applications claims the benefit of U.S. Provisional Application No. 60/775,287 filed Feb. 21, 2006, which is hereby incorporated herein in its entirety by reference.

FIELD OF THE INVENTION

The present invention relates to the field of semiconductors, and, more particularly, to semiconductor devices comprising superlattices and associated methods.

BACKGROUND OF THE INVENTION

Structures and techniques have been proposed to enhance the performance of semiconductor devices, such as by enhancing the mobility of the charge carriers. For example, U.S. Patent Application No. 2003/0057416 to Currie et al. discloses strained material layers of silicon, silicon-germanium, and relaxed silicon and also including impurity-free zones that would otherwise cause performance degradation. The resulting biaxial strain in the upper silicon layer alters the carrier mobilities enabling higher speed and/or lower power devices. Published U.S. Patent Application No. 2003/0034529 to Fitzgerald et al. discloses a CMOS inverter also based upon similar strained silicon technology.

U.S. Pat. No. 6,472,685 B2 to Takagi discloses a semiconductor device including a silicon and carbon layer sandwiched between silicon layers so that the conduction band and valence band of the second silicon layer receive a tensile strain. Electrons having a smaller effective mass, and which have been induced by an electric field applied to the gate electrode, are confined in the second silicon layer, thus, an n-channel MOSFET is asserted to have a higher mobility.

U.S. Pat. No. 4,937,204 to Ishibashi et al. discloses a superlattice in which a plurality of layers, less than eight monolayers, and containing a fraction or a binary compound semiconductor layers, are alternately and epitaxially grown. The direction of main current flow is perpendicular to the layers of the superlattice.

U.S. Pat. No. 5,357,119 to Wang et al. discloses a Si—Ge short period superlattice with higher mobility achieved by reducing alloy scattering in the superlattice. Along these lines, U.S. Pat. No. 5,683,934 to Candelaria discloses an enhanced mobility MOSFET including a channel layer comprising an alloy of silicon and a second material substitutionally present in the silicon lattice at a percentage that places the channel layer under tensile stress.

U.S. Pat. No. 5,216,262 to Tsu discloses a quantum well structure comprising two barrier regions and a thin epitaxially grown semiconductor layer sandwiched between the barriers. Each barrier region consists of alternate layers of SiO2/Si with a thickness generally in a range of two to six monolayers. A much thicker section of silicon is sandwiched between the barriers.

An article entitled "Phenomena in silicon nanostructure devices" also to Tsu and published online Sep. 6, 2000 by Applied Physics and Materials Science & Processing, pp. 391-402 discloses a semiconductor-atomic superlattice (SAS) of silicon and oxygen. The Si/O superlattice is disclosed as useful in a silicon quantum and light-emitting devices. In particular, a green electromuminescence diode structure was constructed and tested. Current flow in the diode structure is vertical, that is, perpendicular to the layers of the SAS. The disclosed SAS may include semiconductor layers separated by adsorbed species such as oxygen atoms, and CO molecules. The silicon growth beyond the adsorbed monolayer of oxygen is described as epitaxial with a fairly low defect density. One SAS structure included a 1.1 nm thick silicon portion that is about eight atomic layers of silicon, and another structure had twice this thickness of silicon. An article to Luo et al. entitled "Chemical Design of Direct-Gap Light-Emitting Silicon" published in Physical Review Letters, Vol. 89, No. 7 (Aug. 12, 2002) further discusses the light emitting SAS structures of Tsu.

Published International Application WO 02/103,767 A1 to Wang, Tsu and Lofgren, discloses a barrier building block of thin silicon and oxygen, carbon, nitrogen, phosphorous, antimony, arsenic or hydrogen to thereby reduce current flowing vertically through the lattice more than four orders of magnitude. The insulating layer/barrier layer allows for low defect epitaxial silicon to be deposited next to the insulating layer.

Published Great Britain Patent Application 2,347,520 to Mears et al. discloses that principles of Aperiodic Photonic Band-Gap (APBG) structures may be adapted for electronic bandgap engineering. In particular, the application discloses that material parameters, for example, the location of band minima, effective mass, etc., can be tailored to yield new aperiodic materials with desirable band-structure characteristics. Other parameters, such as electrical conductivity, thermal conductivity and dielectric permittivity or magnetic permeability are disclosed as also possible to be designed into the material.

Despite considerable efforts at materials engineering to increase the mobility of charge carriers in semiconductor devices, there is still a need for greater improvements. Moreover, the use of advanced materials that may be compatible with different types of semiconductors in a same device may also be advantageous in certain applications, such as monocrystalline semiconductors having different lattice constants, for example.

SUMMARY OF THE INVENTION

In view of the foregoing background, it is therefore an object of the present invention to provide a method for making a semiconductor device that may advantageously include different semiconductor materials with different lattice constants.

This and other objects, features, and advantages are provided by a method for making a semiconductor device which may include forming a first monocrystalline layer comprising a first material having a first lattice constant, a second monocrystalline layer including a second material having a second lattice constant different than the first lattice constant, and a lattice matching layer between the first and second monocrystalline layers and comprising a superlattice. More particularly, the superlattice may include a plurality of groups of layers, and each group of layers may include a plurality of stacked semiconductor monolayers defining a semiconductor base portion and at least one non-semiconductor monolayer thereon. Furthermore, the at least one non-semiconductor monolayer may be constrained within a crystal lattice of adjacent base semiconductor portions, and at least some semiconductor atoms from opposing base semiconductor portions may be chemically bound together through the at least one non-semiconductor monolayer therebetween.

The method may further include converting at least a portion of the second monocrystalline layer to an oxide. By way of example, the first and second lattice constants may be different by not more than ten percent, and more preferably not more than five percent. Also by way of example, the first and second materials may comprise a semiconductor selected from the group consisting of Group IV semiconductors, Group III-V semiconductors, and Group II-VI semiconductors. In accordance with one particular example, the first material may comprise silicon, and the second material may comprise germanium.

In one embodiment, the second monocrystalline layer may comprise a semiconductor, and the method may further include forming at least one active region therein. More particularly, forming the at least one active region may comprise forming spaced apart source and drain regions defining a channel region therebetween. Additionally, the method may also include forming a gate overlying the channel region.

Each base semiconductor portion may comprise a base semiconductor selected from the group consisting of Group IV semiconductors, Group III-V semiconductors, and Group II-VI semiconductors. By way of example, each base semiconductor portion may comprise silicon. Additionally, each non-semiconductor monolayer may comprise a non-semiconductor selected from the group consisting of oxygen, nitrogen, fluorine, and carbon-oxygen.

In accordance with another advantageous embodiment, the lattice matching layer may include at least one lower semiconductor monolayer adjacent the first monocrystalline layer, at least one upper semiconductor monolayer adjacent the second monocrystalline layer, and at least one non-semiconductor monolayer between the at least one lower and at least one upper semiconductor monolayers. Moreover, the at least one non-semiconductor monolayer may be constrained within a crystal lattice of adjacent upper and lower semiconductor monolayers, and at least some semiconductor atoms from the at least one upper and at least one lower semiconductor monolayers may be chemically bound together through the at least one non-semiconductor monolayer therebetween.

DETAILED DESCRIPTION OF THE INVENTION

Figure 1:
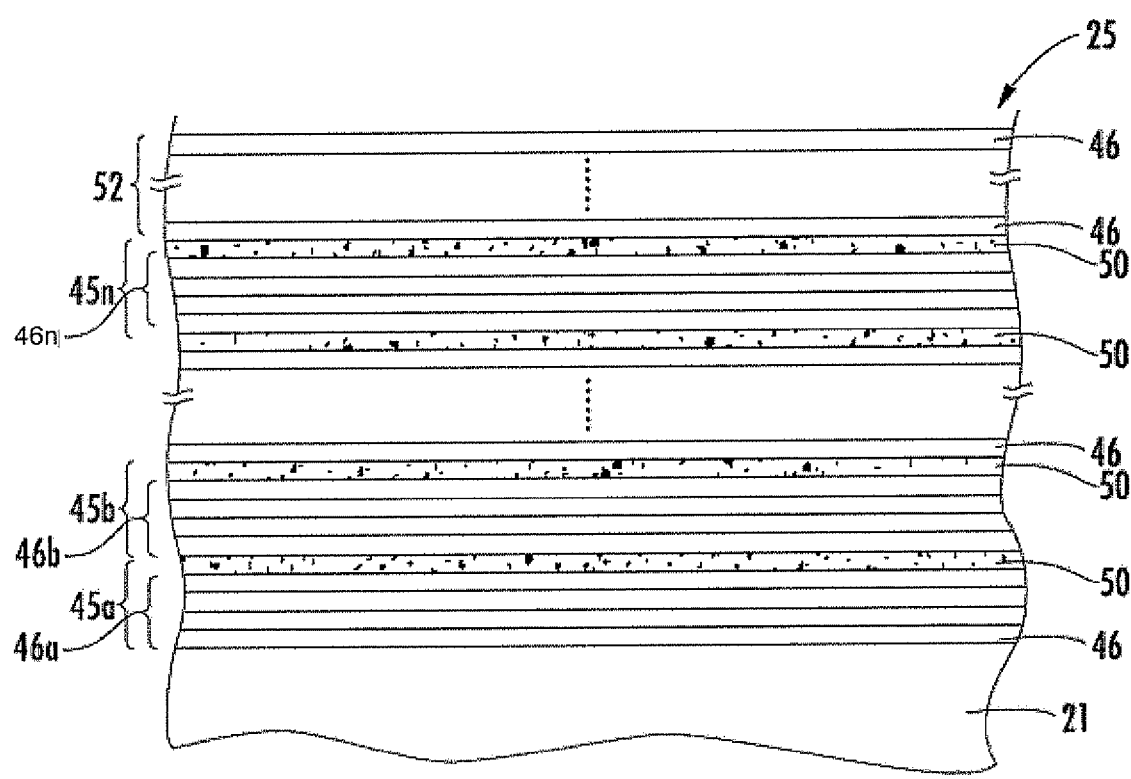
FIG. 1 is a greatly enlarged schematic cross-sectional view of a superlattice for use in a semiconductor device in accordance with the present invention.

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, and prime notation is used to indicate similar elements in alternate embodiments.

The present invention relates to controlling the properties of semiconductor materials at the atomic or molecular level to achieve improved performance within semiconductor devices. Further, the invention relates to the identification, creation, and use of improved materials for use in semiconductor devices.

Applicants theorize, without wishing to be bound thereto, that certain superlattices as described herein reduce the effective mass of charge carriers and that this thereby leads to higher charge carrier mobility. Effective mass is described with various definitions in the literature. As a measure of the improvement in effective mass Applicants use a "conductivity reciprocal effective mass tensor", $M_e^{-1}$ and $M_h^{-1}$ for electrons and holes respectively, defined as:

$$M_{e,ij}^{-1}(E_F, T) = \frac{\sum_{E>E_F} \int_{B.Z.} (\nabla_k E(k,n))_i (\nabla_k E(k,n))_j \frac{\partial f(E(k,n), E_F, T)}{\partial E} d^3k}{\sum_{E>E_F} \int_{B.Z.} f(E(k,n), E_F, T) d^3k}$$

for electrons and:

$$M_{h,ij}^{-1}(E_F, T) = \\ -\frac{\sum_{E<E_F} \int_{B.Z.} (\nabla_k E(k,n))_i (\nabla_k E(k,n))_j \frac{\partial f(E(k,n), E_F, T)}{\partial E} d^3k}{\sum_{E<E_F} \int_{B.Z.} (1 - f(E(k,n), E_F, T)) d^3k}$$

for holes, where f is the Fermi-Dirac distribution, $E_F$ is the Fermi energy, T is the temperature, E(k,n) is the energy of an electron in the state corresponding to wave vector k and the $n^{th}$ energy band, the indices i and j refer to Cartesian coordinates x, y and z, the integrals are taken over the Brillouin zone (B.Z.), and the summations are taken over bands with energies above and below the Fermi energy for electrons and holes respectively.

Applicants' definition of the conductivity reciprocal effective mass tensor is such that a tensorial component of the conductivity of the material is greater for greater values of the corresponding component of the conductivity reciprocal effective mass tensor. Again Applicants theorize without wishing to be bound thereto that the superlattices described herein set the values of the conductivity reciprocal effective mass tensor so as to enhance the conductive properties of the material, such as typically for a preferred direction of charge carrier transport. The inverse of the appropriate tensor element is referred to as the conductivity effective mass. In other words, to characterize semiconductor material structures, the conductivity effective mass for electrons/holes as described above and calculated in the direction of intended carrier transport is used to distinguish improved materials.

Applicants have identified improved materials or structures for semiconductor devices such as MOSFETs, for example. More specifically, the Applicants have identified materials or structures having energy band structures for which the appropriate conductivity effective masses for electrons and/or holes are substantially less than the corresponding values for silicon.

Figure 2:
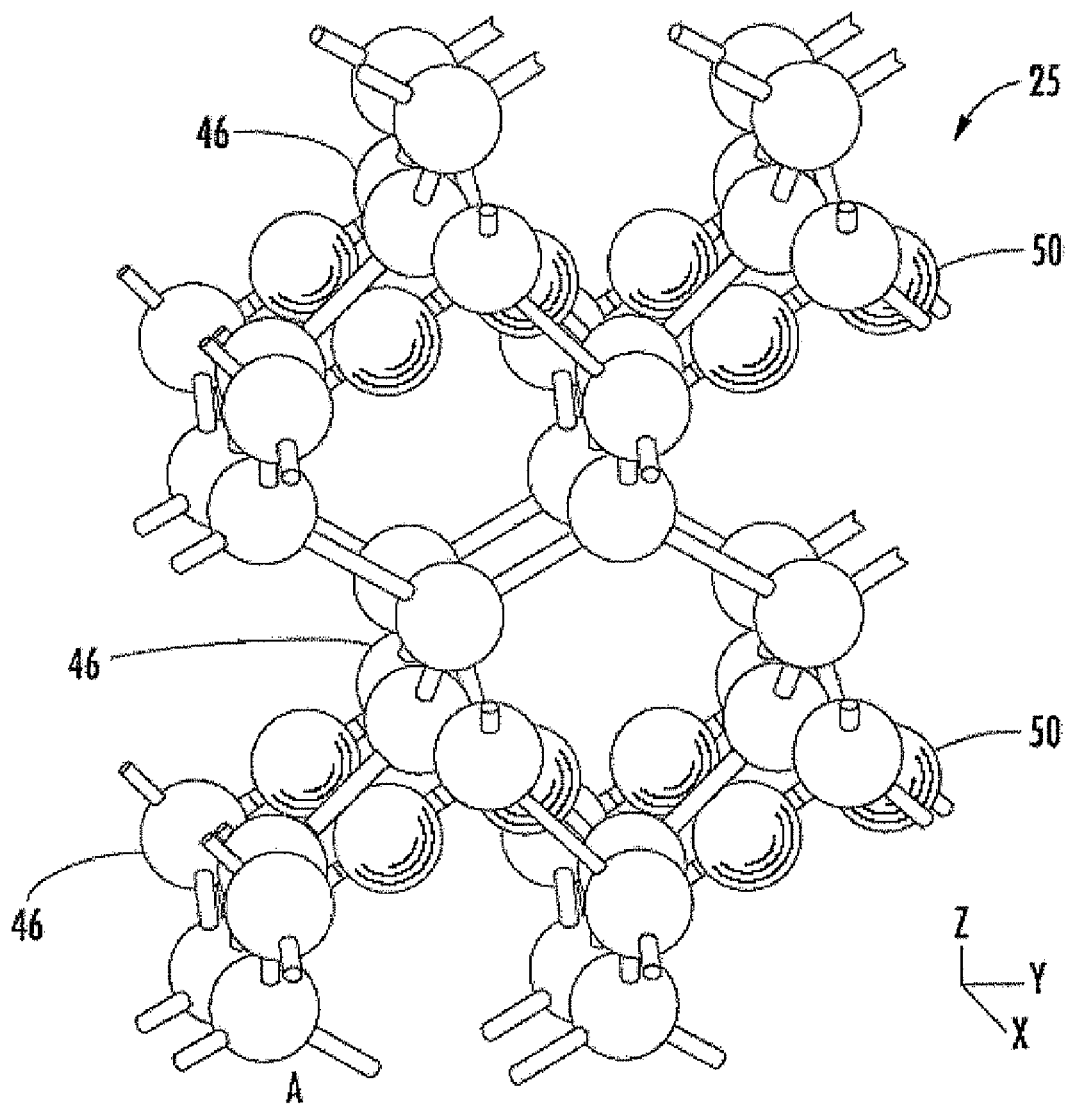
FIG. 2 is a perspective schematic atomic diagram of a portion of the superlattice shown in FIG. 1.

Referring now additionally to FIGS. 1 and 2, the materials or structures are in the form of a superlattice 25 whose structure is controlled at the atomic or molecular level and may be formed using known techniques of atomic or molecular layer deposition. The superlattice 25 includes a plurality of layer groups 45$a$-45$n$ arranged in stacked relation, as perhaps best understood with specific reference to the schematic cross-sectional view of FIG. 1.

Each group of layers 45$a$-45$n$ of the superlattice 25 illustratively includes a plurality of stacked base semiconductor monolayers 46 defining a respective base semiconductor portion 46$a$-46$n$ and an energy band-modifying layer 50 thereon. The energy band-modifying layers 50 are indicated by stippling in FIG. 1 for clarity of illustration.

The energy band-modifying layer 50 illustratively includes one non-semiconductor monolayer constrained within a crystal lattice of adjacent base semiconductor portions. In other embodiments, more than one such monolayer may be possible. It should be noted that reference herein to a non-semiconductor or semiconductor monolayer means that the material used for the monolayer would be a non-semiconductor or semiconductor if formed in bulk. That is, a single monolayer of a material, such as a semiconductor, may not necessarily exhibit the same properties that it would if formed in bulk or in a relatively thick layer, as will be appreciated by those skilled in the art.

Applicants theorize without wishing to be bound thereto that energy band-modifying layers 50 and adjacent base semiconductor portions 46$a$-46$n$ cause the superlattice 25 to have a lower appropriate conductivity effective mass for the charge carriers in the parallel layer direction than would otherwise be present. Considered another way, this parallel direction is orthogonal to the stacking direction. The band-modifying layers 50 may also cause the superlattice 25 to have a common energy band structure. The band modifying layers 50 may also cause the superlattice 25 to have a common energy band structure, while also advantageously functioning as an insulator between layers or regions vertically above and below the superlattice.

Moreover, this structure may also advantageously act as a barrier to dopant and/or material bleed between layers vertically above and below the superlattice 25. These properties may thus advantageously allow the superlattice 25 to provide an interface for high-K dielectrics which not only reduces bleeding of the high-K material into the channel region, but which may also advantageously reduce unwanted scattering effects and improve device mobility, as will be appreciated by those skilled in the art.

It is also theorized that semiconductor devices including the superlattice 25 may enjoy a higher charge carrier mobility based upon the lower conductivity effective mass than would otherwise be present. In some embodiments, and as a result of the band engineering achieved by the present invention, the superlattice 25 may further have a substantially direct energy bandgap that may be particularly advantageous for opto-electronic devices, for example, as described in further detail below.

The superlattice 25 also illustratively includes a cap layer 52 on an upper layer group 45$n$. The cap layer 52 may comprise a plurality of base semiconductor monolayers 46. The cap layer 52 may have between 2 to 100 monolayers of the base semiconductor, and, more preferably between 10 to 50 monolayers.

Each base semiconductor portion 46$a$-46$n$ may comprise a base semiconductor selected from the group consisting of Group IV semiconductors, Group III-V semiconductors, and Group II-VI semiconductors. Of course, the term Group IV semiconductors also includes Group IV-IV semiconductors, as will be appreciated by those skilled in the art. More particularly, the base semiconductor may comprise at least one of silicon and germanium, for example.

Each energy band-modifying layer 50 may comprise a non-semiconductor selected from the group consisting of oxygen, nitrogen, fluorine, and carbon-oxygen, for example. The non-semiconductor is also desirably thermally stable through deposition of a next layer to thereby facilitate manufacturing. In other embodiments, the non-semiconductor may be another inorganic or organic element or compound that is compatible with the given semiconductor processing as will be appreciated by those skilled in the art. More particularly, the base semiconductor may comprise at least one of silicon and germanium, for example.

It should be noted that the term monolayer is meant to include a single atomic layer and also a single molecular layer. It is also noted that the energy band-modifying layer 50 provided by a single monolayer is also meant to include a monolayer wherein not all of the possible sites are occupied. For example, with particular reference to the atomic diagram of FIG. 2, a 4/1 repeating structure is illustrated for silicon as the base semiconductor material, and oxygen as the energy band-modifying material. Only half of the possible sites for oxygen are occupied.

In other embodiments and/or with different materials this one half occupation would not necessarily be the case as will be appreciated by those skilled in the art. Indeed it can be seen even in this schematic diagram, that individual atoms of oxygen in a given monolayer are not precisely aligned along a flat plane as will also be appreciated by those of skill in the art of atomic deposition. By way of example, a preferred occupation range is from about one-eighth to one-half of the possible oxygen sites being full, although other numbers may be used in certain embodiments.

Silicon and oxygen are currently widely used in conventional semiconductor processing, and, hence, manufacturers will be readily able to use these materials as described herein. Atomic or monolayer deposition is also now widely used. Accordingly, semiconductor devices incorporating the superlattice 25 in accordance with the invention may be readily adopted and implemented, as will be appreciated by those skilled in the art.

It is theorized without Applicants wishing to be bound thereto that for a superlattice, such as the Si/O superlattice, for example, that the number of silicon monolayers should desirably be seven or less so that the energy band of the superlattice is common or relatively uniform throughout to achieve the desired advantages. The 4/1 repeating structure shown in FIGS. 1 and 2, for Si/O has been modeled to indicate an enhanced mobility for electrons and holes in the X direction. For example, the calculated conductivity effective mass for electrons (isotropic for bulk silicon) is 0.26 and for the 4/1 SiO superlattice in the X direction it is 0.12 resulting in a ratio of 0.46. Similarly, the calculation for holes yields values of 0.36 for bulk silicon and 0.16 for the 4/1 Si/O superlattice resulting in a ratio of 0.44.

While such a directionally preferential feature may be desired in certain semiconductor devices, other devices may benefit from a more uniform increase in mobility in any direction parallel to the groups of layers. It may also be beneficial to have an increased mobility for both electrons or holes, or just one of these types of charge carriers as will be appreciated by those skilled in the art.

The lower conductivity effective mass for the 4/1 Si/O embodiment of the superlattice 25 may be less than two-thirds the conductivity effective mass than would otherwise occur, and this applies for both electrons and holes. Of course, the superlattice 25 may further comprise at least one type of conductivity dopant therein, as will also be appreciated by those skilled in the art.

Figure 3:
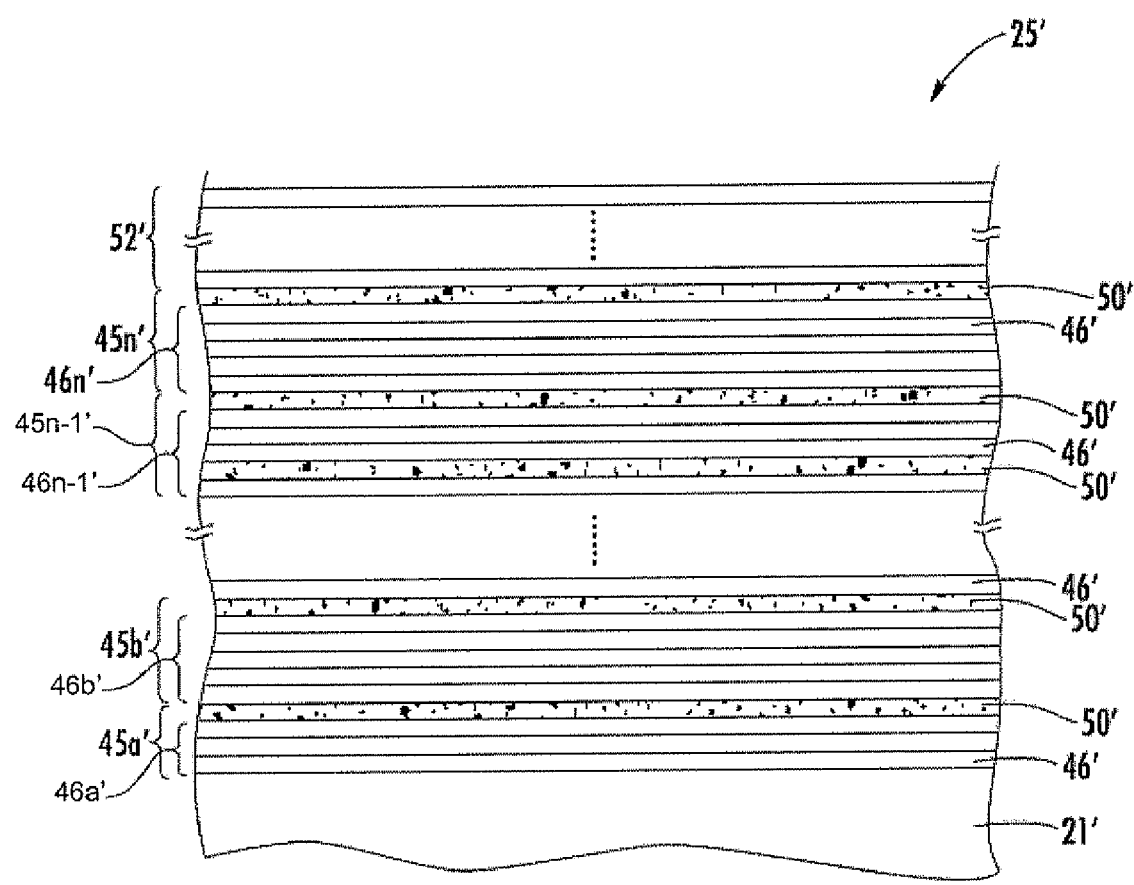
FIG. 3 is a greatly enlarged schematic cross-sectional view of another embodiment of a superlattice that may be used in the device of FIG. 1.

Indeed, referring now additionally to FIG. 3, another embodiment of a superlattice 25' in accordance with the invention having different properties is now described. In this embodiment, a repeating pattern of 3/1/5/1 is illustrated. More particularly, the lowest base semiconductor portion 46a' has three monolayers, and the second lowest base semiconductor portion 46b' has five monolayers. This pattern repeats throughout the superlattice 25'. The energy band-modifying layers 50' may each include a single monolayer. For such a superlattice 25' including Si/O, the enhancement of charge carrier mobility is independent of orientation in the plane of the layers. Those other elements of FIG. 3 not specifically mentioned are similar to those discussed above with reference to FIG. 1 and need no further discussion herein.

In some device embodiments, all of the base semiconductor portions of a superlattice may be a same number of monolayers thick. In other embodiments, at least some of the base semiconductor portions may be a different number of monolayers thick. In still other embodiments, all of the base semiconductor portions may be a different number of monolayers thick.

Figure 4A:
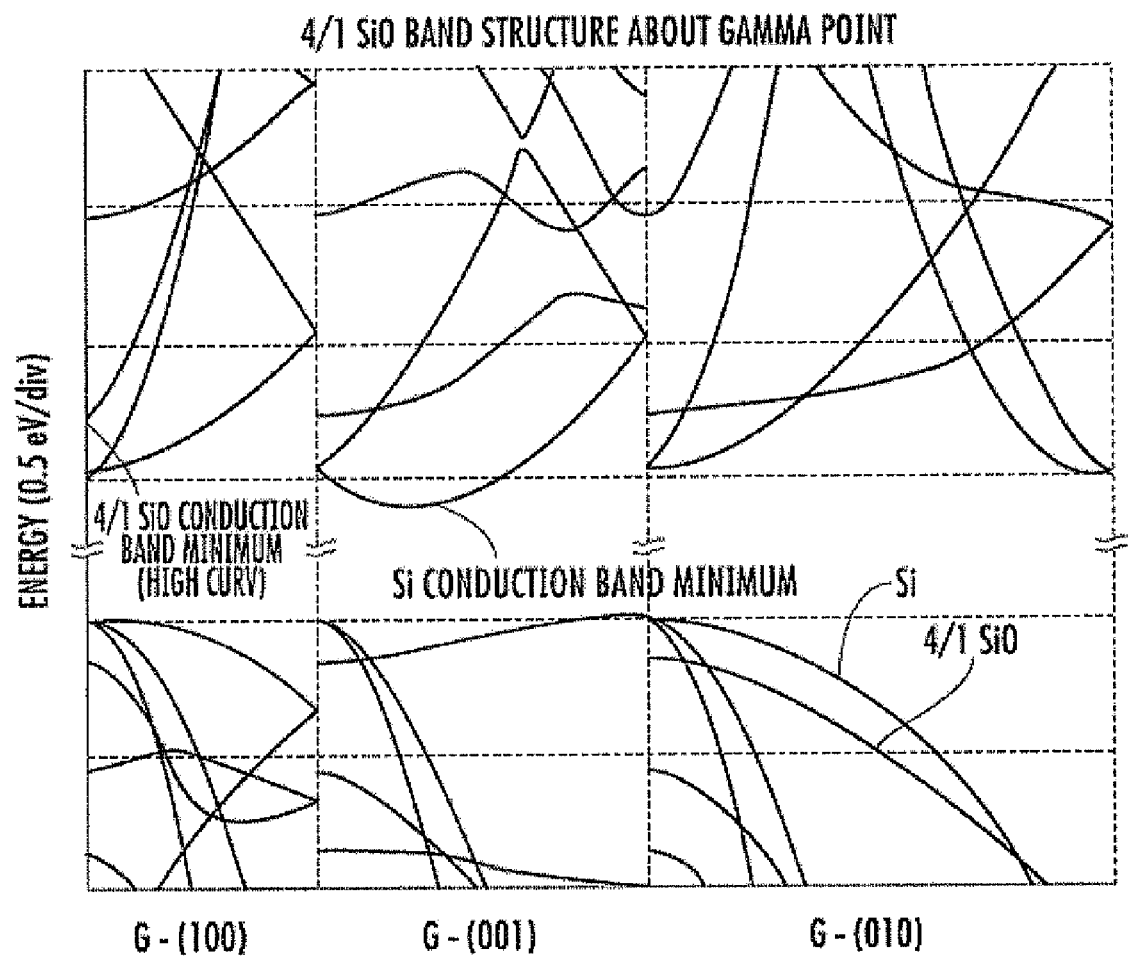
FIG. 4A is a graph of the calculated band structure from the gamma point (G) for both bulk silicon as in the prior art, and for the 4/1 Si/O superlattice as shown in FIGS. 1-2.
Figure 4B:
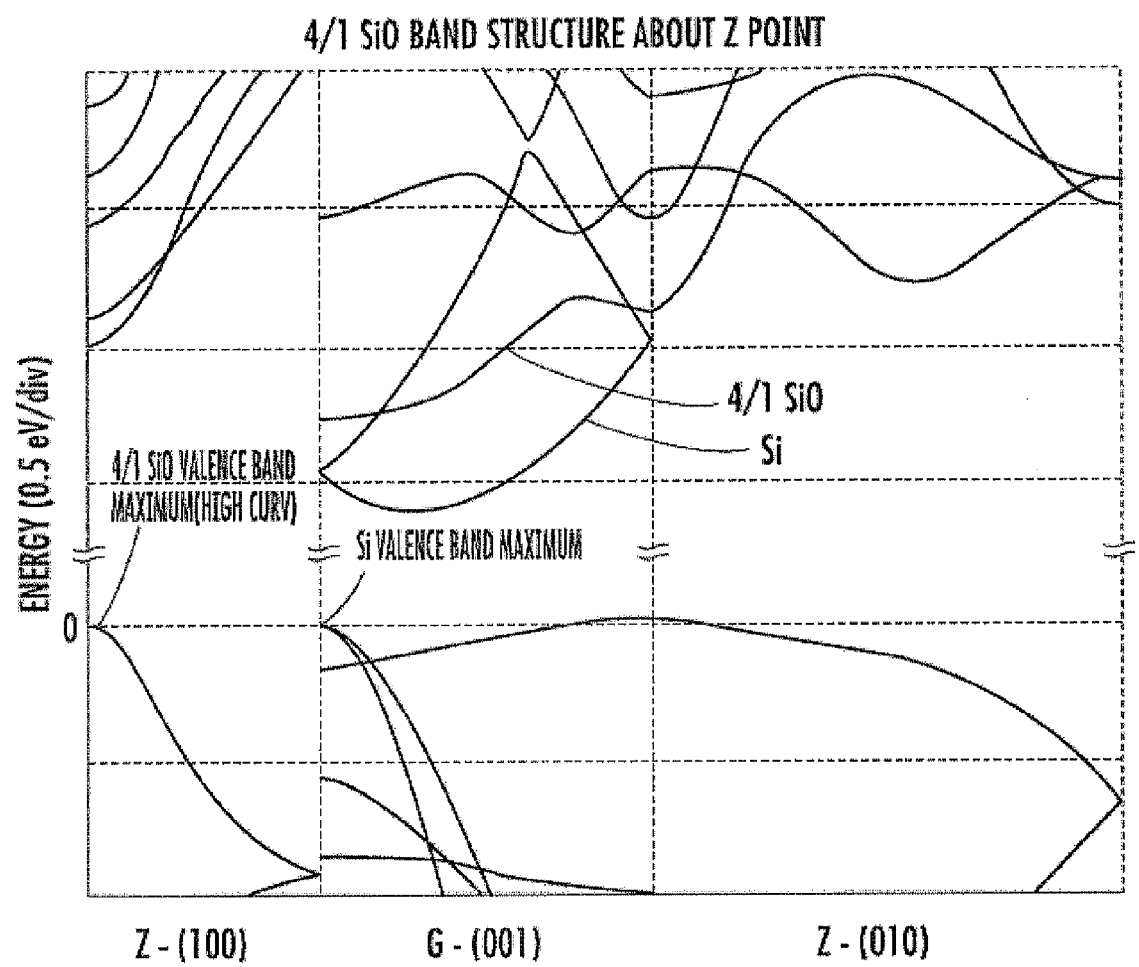
FIG. 4B is a graph of the calculated band structure from the Z point for both bulk silicon as in the prior art, and for the 4/1 Si/O superlattice as shown in FIGS. 1-3.
Figure 4C:
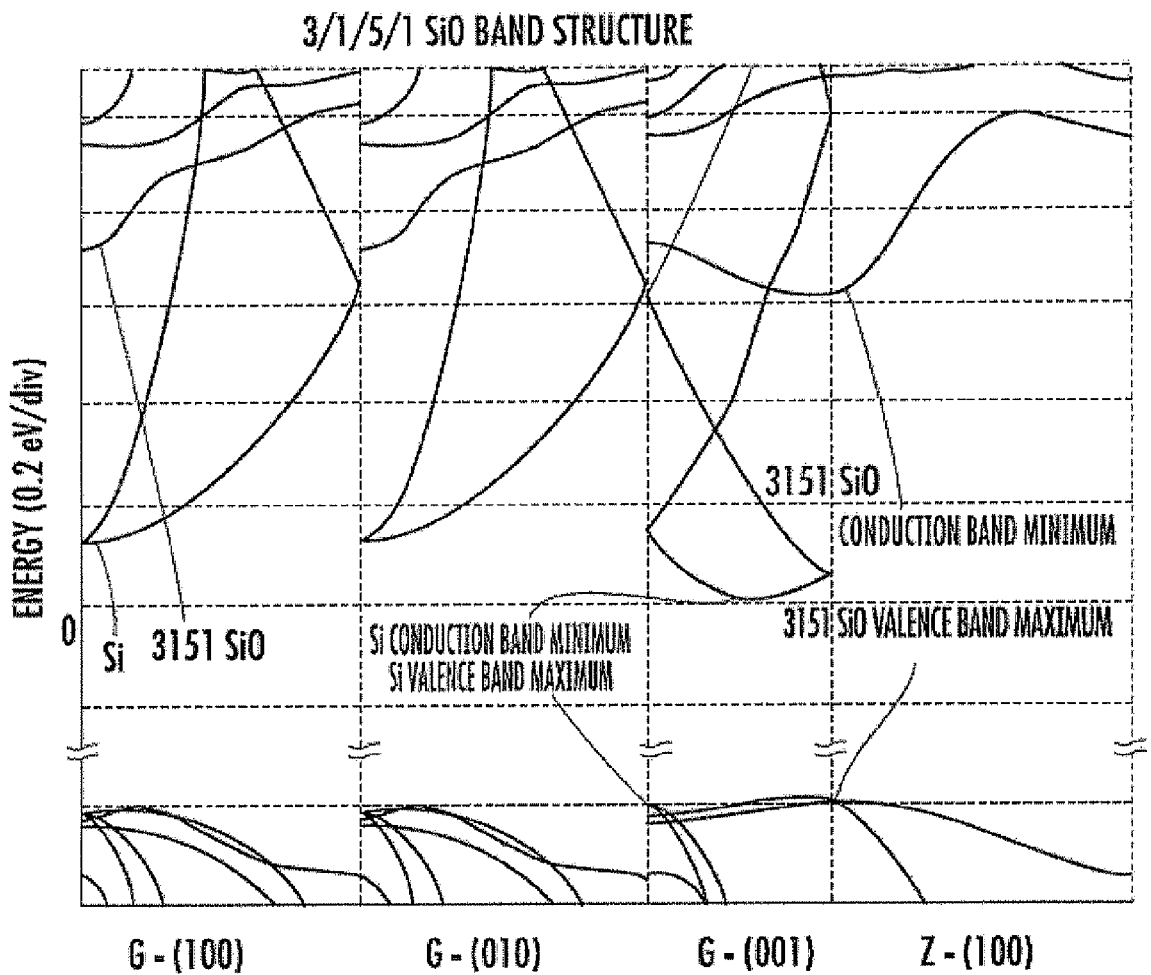
FIG. 4C is a graph of the calculated band structure from both the gamma and Z points for both bulk silicon as in the prior art, and for the 5/1/3/1 Si/O superlattice as shown in FIG. 3.

In FIGS. 4A-4C, band structures calculated using Density Functional Theory (DFT) are presented. It is well known in the art that DFT underestimates the absolute value of the bandgap. Hence all bands above the gap may be shifted by an appropriate "scissors correction." However the shape of the band is known to be much more reliable. The vertical energy axes should be interpreted in this light.

FIG. 4A shows the calculated band structure from the gamma point (G) for both bulk silicon (represented by continuous lines) and for the 4/1 Si/O superlattice 25 shown in FIG. 1 (represented by dotted lines). The directions refer to the unit cell of the 4/1 Si/O structure and not to the conventional unit cell of Si, although the (001) direction in the figure does correspond to the (001) direction of the conventional unit cell of Si, and, hence, shows the expected location of the Si conduction band minimum. The (100) and (010) directions in the figure correspond to the (110) and (−110) directions of the conventional Si unit cell. Those skilled in the art will appreciate that the bands of Si on the figure are folded to represent them on the appropriate reciprocal lattice directions for the 4/1 Si/O structure.

It can be seen that the conduction band minimum for the 4/1 Si/O structure is located at the gamma point in contrast to bulk silicon (Si), whereas the valence band minimum occurs at the edge of the Brillouin zone in the (001) direction which we refer to as the Z point. One may also note the greater curvature of the conduction band minimum for the 4/1 Si/O structure compared to the curvature of the conduction band minimum for Si owing to the band splitting due to the perturbation introduced by the additional oxygen layer.

FIG. 4B shows the calculated band structure from the Z point for both bulk silicon (continuous lines) and for the 4/1 Si/O superlattice 25 (dotted lines). This figure illustrates the enhanced curvature of the valence band in the (100) direction.

FIG. 4C shows the calculated band structure from both the gamma and Z point for both bulk silicon (continuous lines) and for the 5/1/3/1 Si/O structure of the superlattice 25' of FIG. 3 (dotted lines). Due to the symmetry of the 5/1/3/1 Si/O structure, the calculated band structures in the (100) and (010) directions are equivalent. Thus the conductivity effective mass and mobility are expected to be isotropic in the plane parallel to the layers, i.e. perpendicular to the (001) stacking direction. Note that in the 5/1/3/1 Si/O example the conduction band minimum and the valence band maximum are both at or close to the Z point.

Although increased curvature is an indication of reduced effective mass, the appropriate comparison and discrimination may be made via the conductivity reciprocal effective mass tensor calculation. This leads Applicants to further theorize that the 5/1/3/1 superlattice 25' should be substantially direct bandgap. As will be understood by those skilled in the art, the appropriate matrix element for optical transition is another indicator of the distinction between direct and indirect bandgap behavior.

Figure 5:
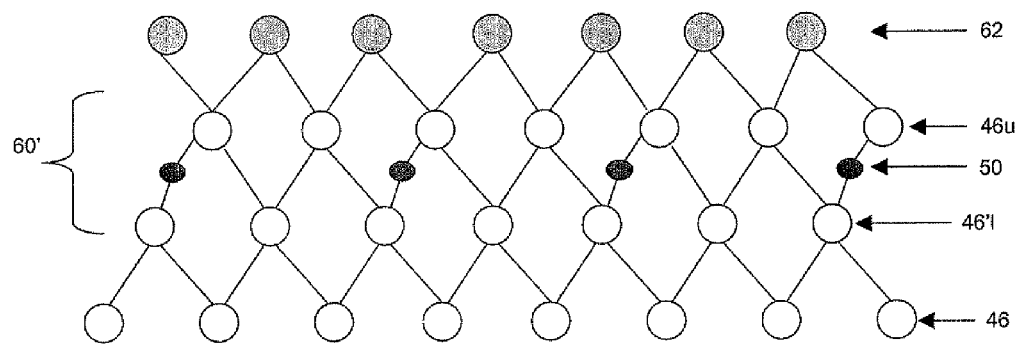
FIG. 5 is a schematic atomic diagram of a portion of a lattice matching layer in accordance with the present invention.
Figure 6:
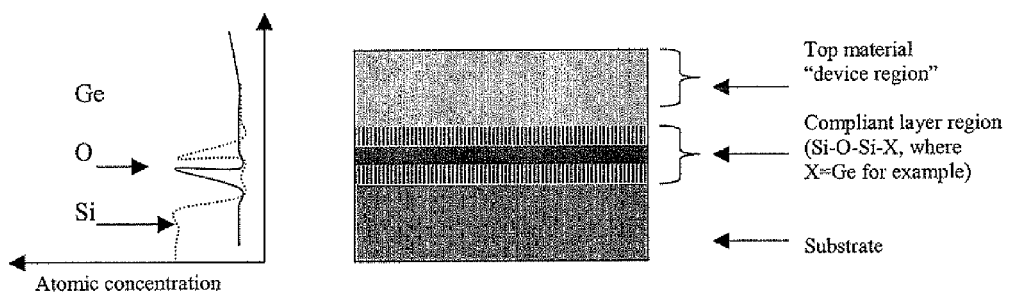
FIG. 6 is a schematic cross-sectional view of a semiconductor device including the lattice matching layer of FIG. 5 and associated atomic concentration graph therefor.

Turning now to FIGS. 5 and 6, in addition to its mobility enhancing and other desirable characteristics, the above-described superlattice (e.g., a Si/O superlattice structure) may act as a compliant lattice matching layer for different semiconductor materials (e.g., silicon and germanium) as a result of the Si—O—Si bond. This advantageously allows the growth of materials on silicon substrates that have a different lattice parameter from silicon.

As will be appreciated by those skilled in the art, in semiconductor processing it is sometimes desirable to use a cost effective substrate (e.g., silicon) as a platform for another more expensive and higher performance material (e.g., germanium) that forms the device layer. That is, an all germanium wafer would be far more expensive than the composite silicon-germanium product. Moreover, some materials (e.g., Group III-V semiconductors) are fragile and therefore cannot be made as large diameter wafers suitable for high volume processing. The ability to use a sacrificial substrate, such as a silicon substrate, with a thin (e.g., less than one micron) higher cost, higher performance layer thereon is therefore desirable.

However, growing a layer of a first monocrystalline semiconductor material on a second monocrystalline semiconductor material with a different lattice constant may cause significant challenges. For example, the grown layers may be extremely thin, suffer from high defect levels, and/or require expensive graded composition layers to slowly match lattice constants between the substrate and the device layer. Some prior art approaches for dealing with these problems include growing high content germanium layers on silicon with a grade layer interface region, re-growth of silicon with different crystal orientations to benefit from mobility enhancements in both p- and n-type devices, and attempting to grow gallium nitride (GaN) on silicon wafers.

The above-described superlattice materials (or even a single non-semiconductor monolayer in some embodiments) may advantageously be used as a lattice matching layer 60' between monocrystalline materials having different lattice constants. In the illustrated example, the lattice matching layer 60' is formed on a silicon layer 46. The lattice matching layer 60' illustratively includes a lower silicon monolayer 46l, one or more oxygen monolayers 50 on the lower silicon monolayer, and an upper silicon monolayer 46u on the oxygen monolayer(s). A germanium layer 62 is then formed on the upper silicon monolayer 46u. It should be noted that in the illustrated embodiment a single upper monolayer 46u and lower monolayer 46l are used, but more than one of these layers may be used in some embodiments. Also, materials other than silicon and oxygen may be used for the semiconductor/non-semiconductor monolayers of the lattice matching layer 60' as described above.

It should also be noted that materials other than germanium may be used for the top (i.e., device) layer on the lattice matching layer 60', such as those set forth in Table 1, below. It should also be noted that materials other than silicon may be used beneath or under the lattice matching layer 60'. This list is not exhaustive and additional elements may be incorporated to account for chemical differences between different materials, as will be appreciated by those skilled in the art. Also, combinations of these materials may also be used. By way of example, the lattice constants of the two material layers (i.e., for the material in bulk) may preferably be different by not more than ten percent, and more preferable not more than five percent, although other percentages may be used in some embodiments.

TABLE 1

| Material | Lattice [Å] | Si mismatch [%] |
|---|---|---|
| Group IV | | |
| Si | 5.431 | 0 |
| Ge | 5.658 | 4.23 |
| Group III-V | | |
| AlP | 5.463 | 0.55 |
| AlAs | 5.661 | 4.23 |
| GaP | 5.45 | 0.36 |
| GaAs | 5.653 | 4.05 |
| InP | 5.868 | 8.1 |
| GaN | 4.531 | 17.0 |
| Group II-VI | | |
| BeTe | 5.627 | 3.68 |
| ZnSe | 5.667 | 4.42 |

Figure 7:
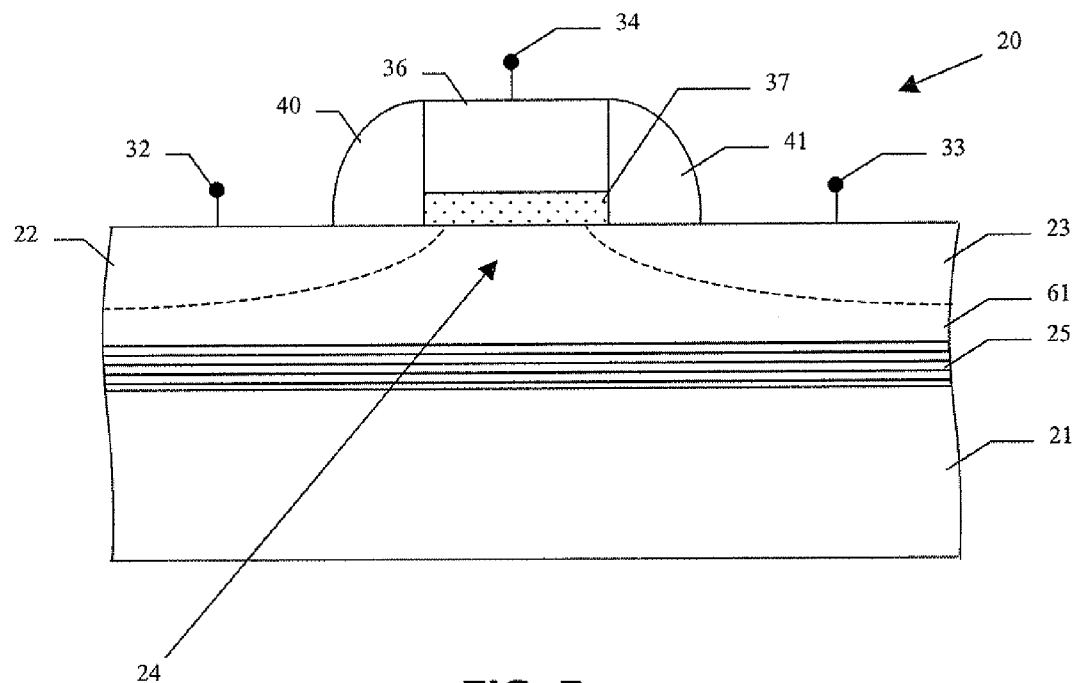
FIG. 7 is a schematic cross-sectional view of another semiconductor device including a superlattice lattice matching layer in accordance with the present invention.

Referring additionally to FIG. 7, a MOSFET device 20 including a superlattice 25 as a lattice matching layer between a silicon substrate 21 and a germanium device layer 61 is now described. Source and drain regions 22, 23 are formed in the germanium device layer 61 to define a channel region 24 therebetween. A gate dielectric (e.g., oxide) layer 37 overlies the channel region 24 on the germanium device layer 61, and a gate electrode layer 36 overlies the gate dielectric layer. Moreover, sidewall spacers 40, 41 are formed adjacent the gate layer stack. Further, source, drain, and gate contacts 32, 33, 34 are illustratively coupled to the source region 22, drain region 23, and gate electrode layer 36, respectively.

Figure 8:
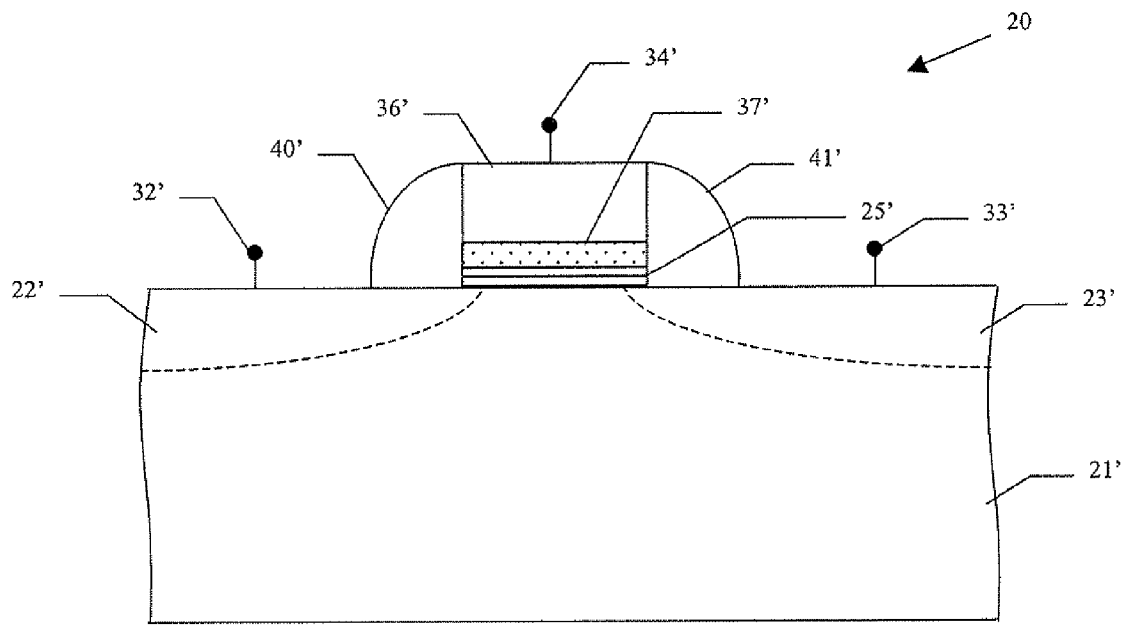
FIG. 8 is a schematic cross-sectional view of yet another semiconductor device including a superlattice lattice matching layer in accordance with the present invention.

In accordance with another embodiment now described with reference to FIG. 8, the lattice matching layer may also be used to grow a silicon layer on another material, such as a germanium substrate/layer 21'. All or a portion of the silicon layer may then advantageously be converted to an oxide layer (e.g., $SiO_2$) to provide the gate oxide layer 37' of a MOSFET device 20' on the germanium layer 21' (i.e., separated from the germanium layer by the superlattice 25'). In some embodiments, the upper silicon layer that is converted to an oxide layer may be the cap layer 52' of the superlattice 25', for example, although in other embodiments there may be additional silicon deposition above the cap layer that is used for oxidation.

In addition, an anneal step may be used to provide desired energy level configuration. More particularly, the anneal step may be used to provide a re-organization into the lowest energy configuration compatible with the lattice constraints of the underlying substrate and the bond energy of the individual elements in the compliant lattice matching layer, as will be appreciated by those skilled in the art.

One benefit of the above-noted approach is that it uses a relatively thin (and therefore relatively low cost) intermediate lattice matching layer or film (e.g., a superlattice 25) to allow device layers including relatively high intrinsic mobility materials to be grown on silicon substrates. Moreover, the ability to grow an $SiO_2$ gate oxide layer on a germanium channel region is also enabled with this approach, as discussed above.

Other features and advantages of the present invention may be gathered from commonly assigned, co-pending application entitled SEMICONDUCTOR DEVICE COMPRISING A LATTICE MATCHING LAYER, Ser. No. 11/677,098, the entire disclosure of which is incorporated herein in its entirety by reference. Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A method for making a semiconductor device comprising:

forming a first monocrystalline layer comprising a first material having a first lattice constant, a second monocrystalline layer comprising a second material having a second lattice constant different than the first lattice constant, and a lattice matching layer between the first and second monocrystalline layers and comprising a superlattice;

the superlattice comprising a plurality of groups of layers, and at least one group of layers comprising a plurality of stacked semiconductor monolayers defining a semiconductor base portion and at least one non-semiconductor monolayer thereon;

the at least one non-semiconductor monolayer being constrained within a crystal lattice of adjacent base semiconductor portions, and at least some semiconductor atoms from opposing base semiconductor portions being chemically bound together through the at least one non-semiconductor monolayer therebetween.

2. The method of claim 1 further comprising converting at least a portion of the second monocrystalline layer to an oxide.

3. The method of claim 1 wherein the first and second lattice constants are different by not more than ten percent.

4. The method of claim 1 wherein the first material comprises a semiconductor selected from the group consisting of Group IV semiconductors, Group III-V semiconductors, and Group II-VI semiconductors.

5. The method of claim 1 wherein the second material comprises a semiconductor selected from the group consisting of Group IV semiconductors, Group III-V semiconductors, and Group II-VI semiconductors.

6. The method of claim 1 wherein the first material comprises silicon; and wherein the second material comprises germanium.

7. The method of claim 1 wherein the second monocrystalline layer comprises a semiconductor; and further comprising forming at least one active region in the second monocrystalline layer.

8. The method of claim 7 wherein forming the at least one active region comprises forming spaced apart source and drain regions defining a channel region therebetween.

9. The method of claim 8 further comprising forming a gate overlying the channel region.

10. The method of claim 1 wherein each base semiconductor portion comprises silicon.

11. The method of claim 1 wherein each base semiconductor portion comprises a base semiconductor selected from the group consisting of Group IV semiconductors, Group III-V semiconductors, and Group II-VI semiconductors.

12. The method of claim 1 wherein each non-semiconductor monolayer comprises oxygen.

13. The method of claim 1 wherein each non-semiconductor monolayer comprises a non-semiconductor selected from the group consisting of oxygen, nitrogen, fluorine, and carbon-oxygen.

14. A method for making a semiconductor device comprising:
   forming a first monocrystalline layer comprising a first material having a first lattice constant, a second monocrystalline layer comprising a second material having a second lattice constant different than the first lattice constant, and a lattice matching layer between the first and second monocrystalline layers;
   the lattice matching layer comprising at least one lower semiconductor monolayer adjacent the first monocrystalline layer, at least one upper semiconductor monolayer adjacent the second monocrystalline layer, and at least one non-semiconductor monolayer between the at least one lower and at least one upper semiconductor monolayers;
   the at least one non-semiconductor monolayer being constrained within a crystal lattice of adjacent upper and lower semiconductor monolayers, and at least some semiconductor atoms from the at least one upper and at least one lower semiconductor monolayers being chemically bound together through the at least one non-semiconductor monolayer therebetween.

15. The method of claim 14 further comprising converting at least a portion of the second monocrystalline layer to an oxide.

16. The method of claim 14 wherein the first and second lattice constants are different by not more than ten percent.

17. The method of claim 14 wherein the first and second materials comprise semiconductors selected from the group consisting of Group IV semiconductors, Group III-V semiconductors, and Group II-VI semiconductors.

18. The method of claim 14 wherein the first material comprises silicon; and wherein the second material comprises germanium.

19. The method of claim 14 wherein the second monocrystalline layer comprises a semiconductor, and further comprising forming spaced apart source and drain regions in the second monocrystalline layer defining a channel region therebetween.

20. The method of claim 19 further comprising forming a gate overlying the channel region.

21. The method of claim 14 wherein the at least one upper and at least one lower semiconductor monolayers comprise silicon.

22. The method of claim 14 wherein the at least one non-semiconductor monolayer comprises oxygen.

23. A method for making a semiconductor device comprising:
   forming a first monocrystalline layer comprising silicon and having a first lattice constant;
   forming a lattice matching layer on the first monocrystalline layer and comprising a superlattice;
   the superlattice comprising a plurality of groups of layers, and each group of layers comprising a plurality of stacked semiconductor monolayers defining a semiconductor base portion and at least one non-semiconductor monolayer thereon;
   the at least one non-semiconductor monolayer being constrained within a crystal lattice of adjacent base semiconductor portions, and at least some semiconductor atoms from opposing base semiconductor portions being chemically bound together through the at least one non-semiconductor monolayer therebetween;
   forming a second monocrystalline layer on the lattice matching layer comprising germanium and having a second lattice constant different than the first lattice constant; and
   forming at least one active region in the second monocrystalline layer.

24. The method of claim 23 wherein the first and second lattice constants are different by not more than ten percent.

25. The method of claim 23 wherein forming the at least one active region comprises forming spaced apart source and drain regions in the second monocrystalline layer defining a channel region therebetween.

26. The method of claim 25 further comprising forming a gate overlying the channel region.

27. The method of claim 23 wherein each base semiconductor portion comprises silicon.

28. The method of claim 23 wherein each non-semiconductor monolayer comprises oxygen.

* * * * *